United States Patent
Sim et al.

(10) Patent No.: US 10,910,155 B2
(45) Date of Patent: Feb. 2, 2021

(54) ELECTRONIC COMPONENT

(71) Applicant: SAMSUNG ELECTRO-MECHANICS CO., LTD., Suwon-si (KR)

(72) Inventors: Won Chul Sim, Suwon-si (KR); Ho Yoon Kim, Suwon-si (KR); Sang Soo Park, Suwon-si (KR); Woo Chul Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/202,058

(22) Filed: Nov. 27, 2018

(65) Prior Publication Data

US 2020/0118744 A1  Apr. 16, 2020

(30) Foreign Application Priority Data

Oct. 15, 2018  (KR) .................. 10-2018-0122489

(51) Int. Cl.
*H01G 2/06* (2006.01)
*H01G 4/232* (2006.01)
*H01G 4/018* (2006.01)
*H01G 4/30* (2006.01)
*H05K 3/30* (2006.01)
(Continued)

(52) U.S. Cl.
CPC ............. *H01G 2/065* (2013.01); *H01G 4/018* (2013.01); *H01G 4/232* (2013.01); *H01G 4/30* (2013.01); *H05K 1/181* (2013.01); *H05K 3/301* (2013.01); *H01G 4/012* (2013.01); *H05K 2201/10378* (2013.01)

(58) Field of Classification Search
CPC .......... H01G 4/008; H01G 4/012; H01G 4/12; H01G 4/30; H01G 4/238; H01G 2/06; H05K 1/18; H05K 1/141; H05K 1/118
See application file for complete search history.

(56) References Cited

U.S. PATENT DOCUMENTS

| 9,460,854 B2 * | 10/2016 | Park .................. H01G 2/065 |
| 2013/0284507 A1 * | 10/2013 | Hattori .................. H05K 1/18 |
| | | 174/260 |

(Continued)

FOREIGN PATENT DOCUMENTS

| JP | 2012-204572 A | 10/2012 |
| JP | 2016-86056 A | 5/2016 |
| JP | 6248644 B2 | 12/2017 |

*Primary Examiner* — Eric W Thomas
(74) *Attorney, Agent, or Firm* — Morgan, Lewis & Bockius LLP

(57) ABSTRACT

An electronic component includes a multilayer capacitor comprising a capacitor body, and an external electrode disposed on an end of the capacitor body, and an interposer comprising an interposer body, and an external terminal disposed on an end of the interposer body. The external terminal includes a connection portion disposed on a first surface of the interposer body and connected to the external electrode, a mounting portion disposed on a second surface of the interposer body opposing the first surface, and a side connection portion disposed on the first and second surfaces and a side surface of the interposer to connect the connection portion and the mounting portion. The side connection portion includes a cutting portion.

20 Claims, 6 Drawing Sheets

(51) Int. Cl.
    *H05K 1/18*    (2006.01)
    *H01G 4/012*   (2006.01)

(56) References Cited

U.S. PATENT DOCUMENTS

| | | |
|---|---|---|
| 2014/0016242 A1 | 1/2014 | Hattori et al. |
| 2015/0122534 A1* | 5/2015 | Park .................... H01G 2/065 174/260 |
| 2015/0206661 A1* | 7/2015 | Fujimura ............... H01G 4/30 361/301.4 |
| 2016/0086733 A1* | 3/2016 | Saito .................. H01G 4/0085 361/301.4 |
| 2016/0118192 A1 | 4/2016 | Fujimura et al. |
| 2016/0227651 A1* | 8/2016 | Mori ..................... H05K 1/181 |
| 2017/0011857 A1* | 1/2017 | Hattori .................. H01G 4/40 |
| 2017/0105283 A1* | 4/2017 | Kim ................... H05K 1/0346 |
| 2017/0290161 A1* | 10/2017 | Shimura ................ H01G 4/12 |

* cited by examiner

ELECTRONIC COMPONENT

CROSS-REFERENCE TO RELATED APPLICATION(S)

This application claims the benefit of priority to Korean Patent Application No. 10-2018-0122489 filed on Oct. 15, 2018 in the Korean Intellectual Property Office, the disclosure of which is incorporated herein by reference in its entirety.

TECHNICAL FIELD

The present disclosure relates to an electronic component.

BACKGROUND

As a multilayer electronic component, a multilayer capacitor may be formed of a dielectric material. As the dielectric material has piezoelectric properties, the dielectric material may be synchronized to an applied voltage and may be changed.

When a period of the applied voltage is within an audible frequency band, a phase may oscillate and may be conveyed to a substrate through a solder, and vibrations of the substrate may be heard. Such vibratory sound is known as acoustic noise.

When a device is in a quiet environment, a user may perceive the acoustic noise as an abnormal sound coming from the device, and the user may consider the device to be broken.

Also, in the case of a device having an audio circuit, the acoustic noise may be overlapped with an audio output, which may degrade sound quality of the device.

Differently from the acoustic noise perceived by human ears, when piezoelectric vibrations occur in a high frequency region, a frequency of 20 kHz or higher, the vibrations may cause errors in sensors used in an IT industry/field.

SUMMARY

An aspect of the present disclosure may provide an electronic component capable of reducing acoustic noise, and high frequency vibrations occurring in a frequency of 20 kHz or higher.

According to an aspect of the present disclosure, an electronic component includes a multilayer capacitor comprising a capacitor body, and an external electrode disposed on an end of the capacitor body, and an interposer comprising an interposer body, and an external terminal disposed on an end of the interposer body. The external terminal includes a connection portion disposed on a first surface of the interposer body and connected to the external electrode, a mounting portion disposed on a second surface of the interposer body opposing the first surface, and a side connection portion disposed on a side surface of the interposer to connect the connection portion and the mounting portion and having a cutting portion.

The cutting portion of the side connection portion may be arranged in a central portion of the side connection portion in a thickness direction.

When a thickness of a lower portion of the side connection portion is defined as A, a thickness of an upper portion is defined as B, and an overall thickness of the external terminal is defined as C, $(A+B)/C$ may satisfy $0<(A+B)/C\leq 0.3$.

The electronic component may further include a conductive adhesive layer disposed between the external electrode and the connection portion.

The interposer body may include alumina.

The capacitor body may include first and second surfaces opposing each other, third and fourth surfaces connected to the first and second surfaces and opposing each other, and fifth and sixth surfaces connected to the first and second surfaces and the third and fourth surfaces and opposing each other, and comprising a plurality of dielectric layers, and a plurality of first and second internal electrodes alternately disposed with the dielectric layer interposed therebetween in a direction connecting the fifth and sixth surfaces, and one ends of the first and second internal electrodes may be exposed through the third and fourth surfaces, respectively.

The external electrodes may respectively include first and second head portions disposed on the third and fourth surfaces of the capacitor body, respectively, and connected to the first and second internal electrodes, respectively, and first and second band portions extended from the first and second head portions to a portion of the first surface of the capacitor body, respectively.

The electronic component may further include a plating layer disposed on surfaces of the external electrodes and the external terminals.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
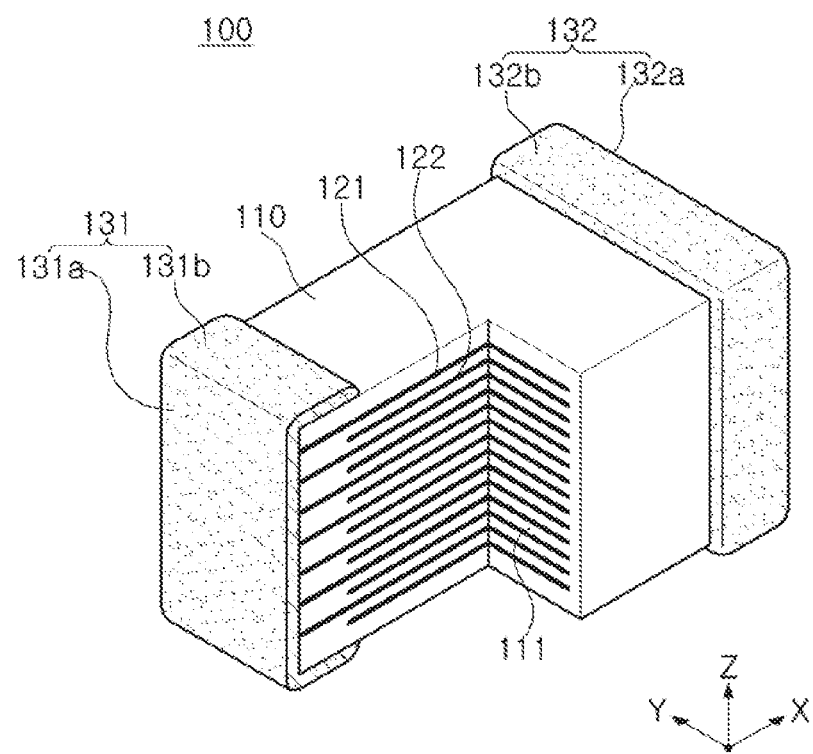
FIG. 1 is a perspective diagram illustrating a multilayer capacitor according to an exemplary embodiment in the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Accordingly, shapes and sizes of elements in the drawings may be exaggerated for clarity of description, and elements indicated by the same reference numeral are same elements in the drawings.

Further, throughout the specification, it will be understood that when a portion "includes" an element, it can further include another element, not excluding another element, unless otherwise indicated.

In the exemplary embodiment, an X direction, a Y direction, and a Z direction in the drawings may indicate a length direction, a width direction, and a thickness direction of a multilayer capacitor and an interposer, respectively.

A Z direction may be the same as a layering direction in which the dielectric layers area are layered.

Figure 2A:
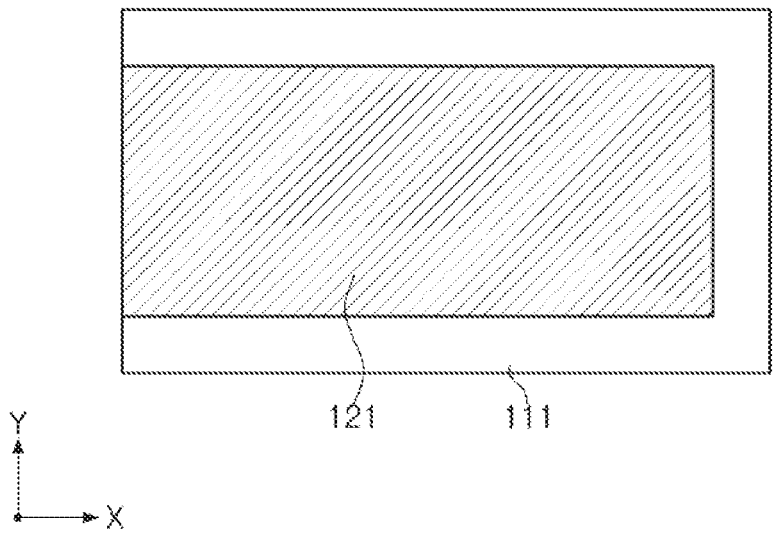
FIGS. 2A and 2B are top views illustrating first and second internal electrodes of a multilayer capacitor in FIG. 1.
Figure 2B:
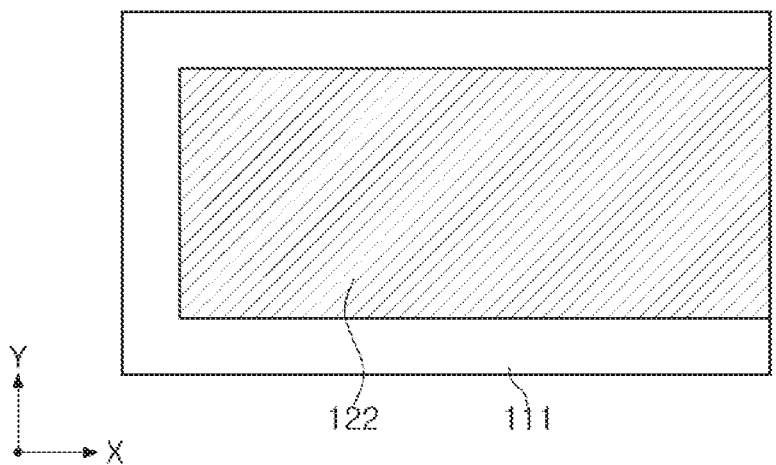

FIG. 1 is a perspective diagram illustrating a multilayer capacitor according to an exemplary embodiment. FIGS. 2A and 2B are top views illustrating first and second internal electrodes of a multilayer capacitor in FIG. 1.

In the description below, a multilayer capacitor applied in an electronic component according to an exemplary embodiment will be described with reference to FIGS. 1 to 2B.

A multilayer capacitor 100 in the exemplary embodiment may include a capacitor body 110 and first and second external electrodes 131 and 132 disposed on both ends of the capacitor body 110 in an X direction.

The capacitor body 110 may be manufactured by layering a plurality of dielectric layers 111 in a Y direction and sintering the stacked plurality of dielectric layers 111. The dielectric layers 111 may be integrated such that boundaries between adjacent dielectric layers 111 may be difficult to identify without using a scanning electron microscope (SEM).

The capacitor body 110 may also include the plurality of dielectric layers 111 and first and second internal electrodes 121 and 122 alternately disposed with the dielectric layer 111 interposed therebetween in a Z direction and having different polarities.

The capacitor body 110 may include an active area, a portion contributing to capacitance of a capacitor, and cover portions 112 and 113 arranged on side portions of the capacitor body 110 in a Y direction and in upper and lower portions of the active area in a Z direction, respectively, as margin portions.

A shape of the capacitor body 110 may not be limited to any particular shape. The capacitor body 110 may have, for example, a hexagonal shape. The capacitor body 110 may also include first and second surfaces S1 and S2 opposing each other in a Z direction, third and fourth surfaces S3 and S4 connected to the first and second surfaces S1 and S2 and opposing each other in an X direction, and fifth and sixth surfaces S5 and S6 connected to the first and second surfaces S1 and S2 and the third and fourth surfaces S3 and S4 and opposing each other.

The dielectric layer may include a ceramic powder such as a $BaTiO_3$ ceramic powder, for example.

The $BaTiO_3$ ceramic powder may be $(Ba_{1-x}Ca_x)TiO_3$ $Ba(Ti_{1-y}Ca_y)O_3$, $(Ba_{1-x}Ca_x)(Ti_{1-y}Zr_y)O_3$ or $Ba(Ti_{1-y}Zr_y)O_3$ in which Ca or Zr is partially employed in $BaTiO_3$, but the $BaTiO_3$ ceramic powder is not limited thereto.

As the material composing the dielectric layer 111, various ceramic additives, organic solvents, coupling agents, dispersing agents, and the like, may be added in addition to the ceramic powder.

The ceramic additive may include a transition metal oxide or a transition metal carbide, a rare earth element, magnesium (Mg), aluminum (Al), and the like, for example.

The first and second internal electrodes 121 and 122 may have currents having different polarities applied thereto, and may be disposed on the dielectric layer 111 and layered in a Y direction. The first and second internal electrodes 121 and 122 may be alternately disposed with a single dielectric layer 111 interposed therebetween in a Y direction in the capacitor body 110.

In this case, the first and second internal electrodes 121 and 122 may be electrically connected to each other through the dielectric layer 111 interposed therebetween.

Meanwhile, the exemplary embodiment illustrates the configuration in which the internal electrodes are layered in a Y direction, but an exemplary embodiment thereof is not limited thereto. If necessary, the internal electrodes may be layered in a Z direction, for example.

One ends of the first and second internal electrodes 121 and 122 may be exposed through the third and fourth surfaces S3 and S4 of the capacitor body 110, respectively.

One ends of the first and second internal electrodes 121 and 122 alternately exposed through the third and fourth surfaces S3 and S4 of the capacitor body 110 may be electrically connected to the first and second external electrodes 131 and 132, respectively, which are disposed on both ends of the capacitor body 110 in an X direction.

Accordingly, once a certain voltage is applied to the first and second external electrodes 131 and 132, an electrical charge may be accumulated between the first and second internal electrodes 121 and 122.

In this case, capacitance of the multilayer capacitor 100 may be proportionate to an area of overlap between the first and second internal electrodes 121 and 122, overlapping in a Z direction, in the active area.

Also, a material of the first and second internal electrodes 121 and 122 may not be limited to any particular material. A material may be formed of a conductive paste comprised of one or more materials such as palladium (Pd), palladium-silver (Pd—Ag) alloy, and the like, and nickel (Ni) and copper (Cu), for example.

As a printing method of the conductive paste, a screen printing method, a gravure printing method, or the like, may be used, but the method is not limited thereto.

The first and second external electrodes 131 and 132 may be supplied with voltages having different polarities, may be disposed on both ends of the capacitor body 110 in an X direction, and may be electrically connected to exposed ends of the first and second internal electrodes 121 and 122.

The first external electrode 131 may include a first head portion 131a and a first band portion 131b.

The first head portion 131a may be disposed on the third surface 3 of the capacitor body 110, and may be in contact with an end exposed externally through the third surface 3 of the capacitor body 110 in the first internal electrode 121 and electrically connect the first internal electrode 121 and the first external electrode 131.

The first band portion 131b may be extended to a portion of the first surface 1 of the body 110 from the first head portion 131a.

The first band portion 131b may be further extended to portions of the second, fifth, and sixth surfaces of the body 110 from the first head portion 131a to improve adhesion strength, and the like.

The second external electrode 132 may include a second head portion 132a and a second band portion 132b.

The second head portion 132a may be disposed on the fourth surface 4 of the capacitor body 110, and may be in contact with an end exposed externally through the fourth surface 4 of the capacitor body 110 in the second internal electrode 122 and electrically connect the second internal electrode 122 and the second external electrode 132.

The second band portion 132b may be extended to a portion of the first surface 1 of the body 110 from the second head portion 132a.

The second band portion 132b may be further extended to portions of the second, fifth, and sixth surfaces of the body 110 from the second head portion 132a to improve adhesion strength, and the like.

The first and second external electrodes 131 and 132 may further include a plating layer.

The plating layer may include first and second nickel (Ni) plated layers, and first and second tin (Sn) plated layers covering the first and second nickel (Ni) plated layers, respectively.

Figure 3:
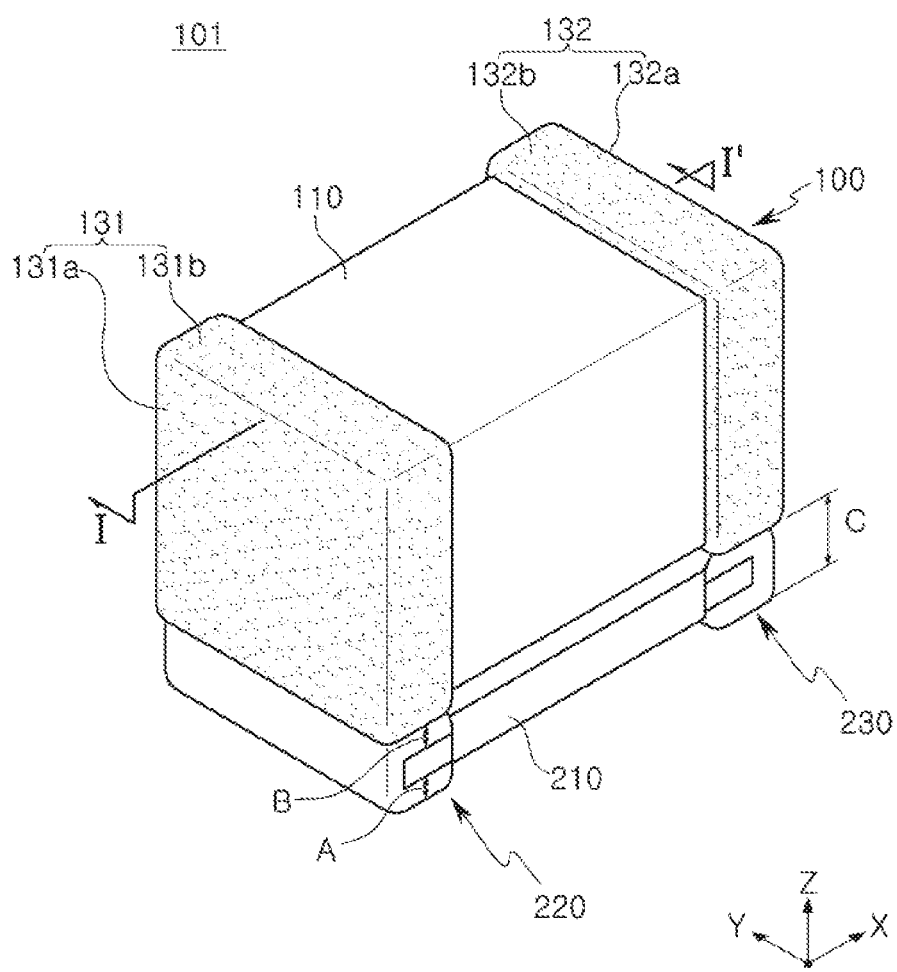
FIG. 3 is a perspective diagram illustrating an electronic component according to an exemplary embodiment in the present disclosure.
Figure 4:
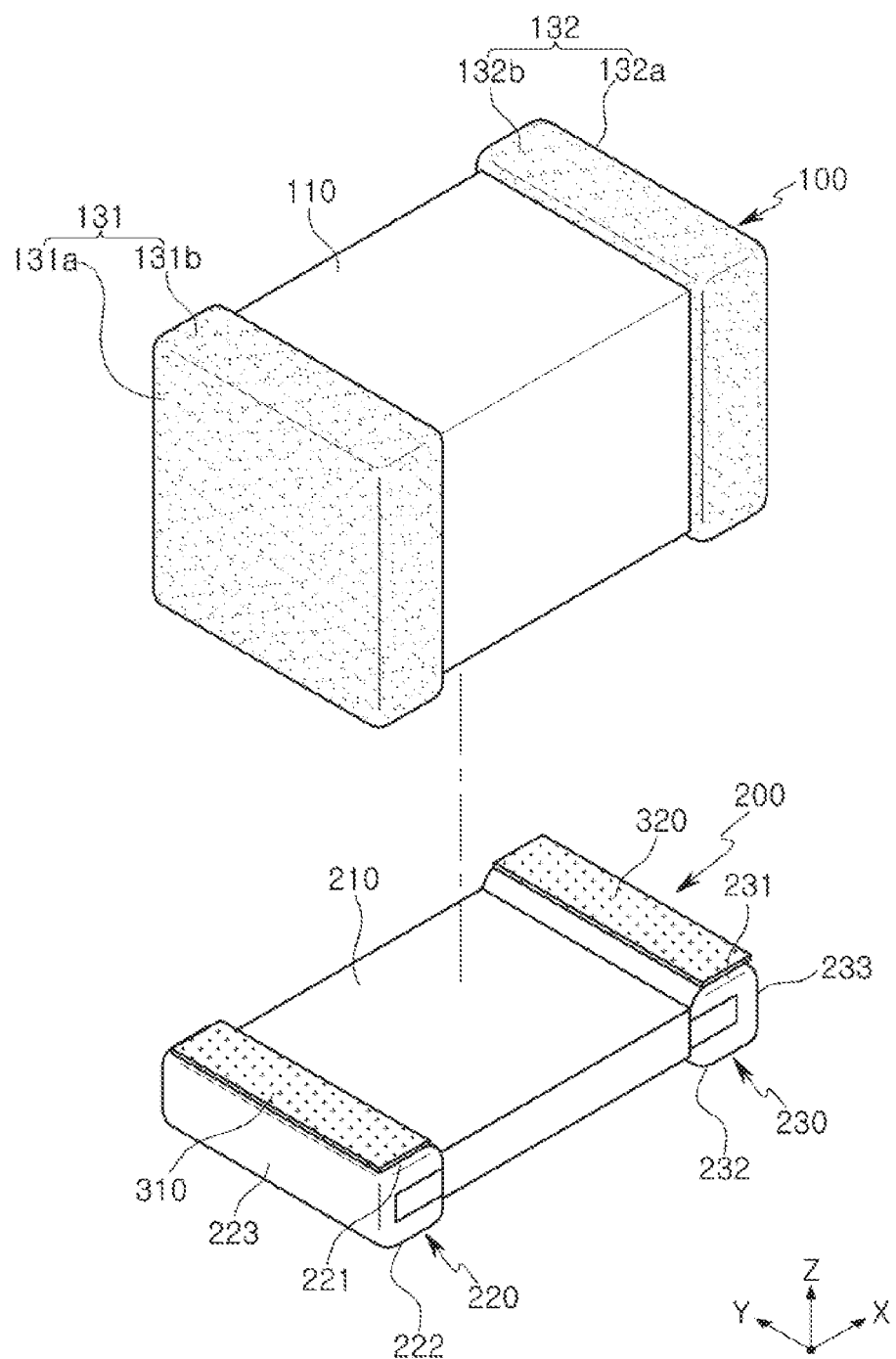
FIG. 4 is a diagram illustrating separation of an electronic component in FIG. 3.
Figure 5:
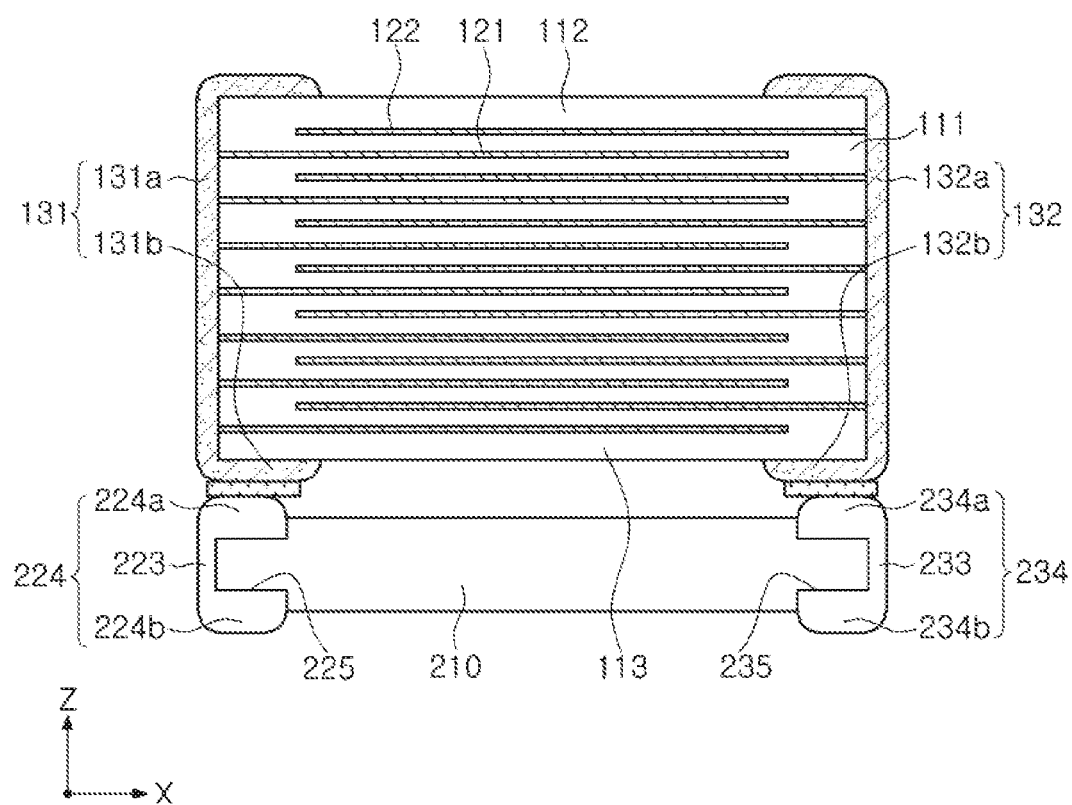
FIG. 5 is a cross-sectional diagram taken along line I-I' in FIG. 3.

FIG. 3 is a perspective diagram illustrating an electronic component according to an exemplary embodiment. FIG. 4 is a diagram illustrating separation of an electronic component in FIG. 3. FIG. 5 is a cross-sectional diagram taken along line I-I' in FIG. 3.

Referring to FIGS. 3 to 5, an electronic component 101 according to an exemplary embodiment may include a multilayer capacitor 100 and an interposer 200.

The interposer 200 may include an interposer body 210, and first and second external terminals 220 and 230 disposed in both ends of the interposer body 210 in an X direction, respectively.

The interposer body 210 may be formed of a ceramic material, such as alumina, for example.

A length of the interposer body 210 in an X direction and a width in a Y direction may be lower than a length of the capacitor body 110 in an X direction and a width in a Y direction, respectively.

The first and second external terminals 220 and 230 may be supplied with voltages having different polarities, and may be electrically connected to first and second band portions 131b and 132b of first and second external electrodes 131 and 132, respectively.

The first external terminal 220 may include a first connection portion 221, a first mounting portion 222, a first cross-section connection portion 223, and a pair of first side connection portions 224.

The first connection portion 221 may be disposed on a top surface of the interposer body 210, and one end of the interposer body 210 in an X direction, and connected to the first band portion 131b of the first external electrode 131.

The first connection portion 221 and the first band portion 131b may be connected to each other by a first conductive adhesive layer 310 disposed therebetween.

The first conductive adhesive layer 310 may be formed by a high temperature soldering, or formed of a conductive adhesive.

The first mounting portion 222 may be disposed on a bottom surface of the interposer body 210 and face the first connection portion 221 in a Z direction, and may work as a terminal when being mounted on a substrate.

The first cross-section connection portion 223 may be disposed on a cross-sectional surface of the interposer body 210 in an X direction, and may connect an end of the first connection portion 221 and an end of the first mounting portion 222.

Accordingly, the first external terminal 220 may have an X-Z cross-section having a ⊏ shape.

The first side connection portions 224 may be disposed on both surfaces of the interposer body 110 in a Y direction, and may connect a fore end of the first connection portion 221 and a fore end of the first mounting portion 222.

Also, the first side connection portions 224 may have a first cutting portion 225.

The first cutting portion 225 may be disposed in a central portion of the first side connection portions 224 in a Z direction.

When a thickness of a lower portion 224b of the first side connection portions 224 is defined as "A," a thickness of an upper portion 224a is defined as "B," and an overall thickness of the first external terminal 220 in a Z direction is defined as "C," (A+B)/C may satisfy 0<(A+B)/C≤0.3.

In this case, the thickness of the lower portion 224b may be approximately the same as the thickness of the upper portion 224a, but an exemplary embodiment thereof is not limited thereto. If necessary, the thickness of the lower portion 224b may be greater than the thickness of the upper portion 224a, or vice versa, to adjust adhesion strength and acoustic noise.

The second external terminal 230 may include a second connection portion 231, a second mounting portion 232, a second cross-section connection portion 233, and a pair of second side connection portions 234.

The second connection portion 231 may be formed on a top surface of the interposer body 210 and one end of the other surface of the interposer body 210 in an X direction, and the second connection portion 231 may be connected to the second band portion 132b of the second external electrode 132.

The second connection portion 231 and the second band portion 132b may be connected to each other by a second conductive adhesive layer 320 disposed therebetween.

The second conductive adhesive layer 320 may be formed by high temperature soldering, or may be formed of a conductive adhesive.

The second mounting portion 232 may be disposed on a bottom surface of the interposer body 210 and face the second connection portion 231 in a Z direction, and may work as a terminal when being mounted on a substrate.

The second cross-section connection portion 233 may be disposed on the other cross-section of the interposer body 210 in an X direction, and may connect an end of the second connection portion 231 and an end of the second mounting portion 232.

Accordingly, the second external terminal 230 may have an X-Z cross-section having a ⊐ shape.

A second side connection portion 234 may be disposed on both surfaces of the interposer body 110 in a Y direction, and may connect a fore end of the second connection portion 231 and a fore end of the second mounting portion 232.

The second side connection portion 234 may have a second cutting portion 235.

The second cutting portion 235 may be arranged in a central portion of the second side connection portion 234 in a Z direction.

A thickness of the interposer body 210 may be greater at a central portion of the interposer body 210 relative to an end of the interposer body 210, and the cutting portion 235 of the side connection portion 234 may be disposed adjacent to a portion of the interposer body 210 having a reduced thickness. A step may be disposed between the central portion of the interposer body 210 and the portion of the interposer body 210 having the reduced thickness.

When a thickness of a lower portion 234b of the second side connection portion 234 is defined as "A," a thickness of an upper portion 234a is defined as "B," and an overall thickness of the second external terminal 230 in a Z direction is defined as "C," (A+B)/C may satisfy 0<(A+B)/C≤0.3.

In this case, the thickness of the lower portion 234b may be approximately the same as the thickness of the upper portion 234a, but an exemplary embodiment thereof is not limited thereto. If necessary, the thickness of the lower portion 234b may be greater than the thickness of the upper portion 234a, or vice versa, to adjust adhesion strength and acoustic noise.

A plating layer may be further disposed on surfaces of the first and second external terminals 220 and 230.

The plating layer may include a nickel (Ni) plated layer and a tin (Sn) plated layer covering the nickel (Ni) plated layer.

When voltages having different polarities are applied to the first and second external electrodes 131 and 132 formed in the electronic component 101 while the electronic component 101 is mounted on a substrate, the capacitor body 110 may be expanded and contracted in a Z direction by an inverse piezoelectric effect.

Accordingly, both ends of the first and second external electrodes 131 and 132 may be contracted and expanded by an inverse piezoelectric effect in a manner opposite to that of the capacitor body 110 expanded and contracted in a Z direction.

The contraction and expansion may cause vibrations, and the vibrations may be conveyed to a substrate through the first and second external electrodes 131 and 132 and the first and second external terminals 220 and 230. The sounds from the substrate may be acoustic noise.

To reduce the acoustic noise, an electronic component using an interposer has been developed.

However, the electronic component using an interposer may not significantly reduce the acoustic noise, or when being mounted on a substrate, adhesion strength is not secured between a multilayer capacitor and the interposer, which may cause mounting defects.

Thus, it has been necessary to further reduce the acoustic noise efficiently and to secure adhesion strength at the same time.

The interposer 200 in the exemplary embodiment may be attached to the side portion of the first surface of the multilayer capacitor 100, disposed in a mounting direction, and may prevent the vibrations of the multilayer capacitor 100 from being conveyed to a substrate, thereby reducing the acoustic noise of the multilayer capacitor 100.

Also, in the exemplary embodiment, a portion of the side connection portion may be formed as a cutting portion, rather than using the cross-section connection portion in which connection terminals of the interposer 200 are formed on both surfaces thereof, and the path through which vibrations are conveyed may be reduced. Accordingly, acoustic noise may be reduced, and degradation of adhesion strength with a substrate may be significantly reduced as well, thereby preventing mounting defects when the electronic component is mounted on a substrate.

Figure 6:
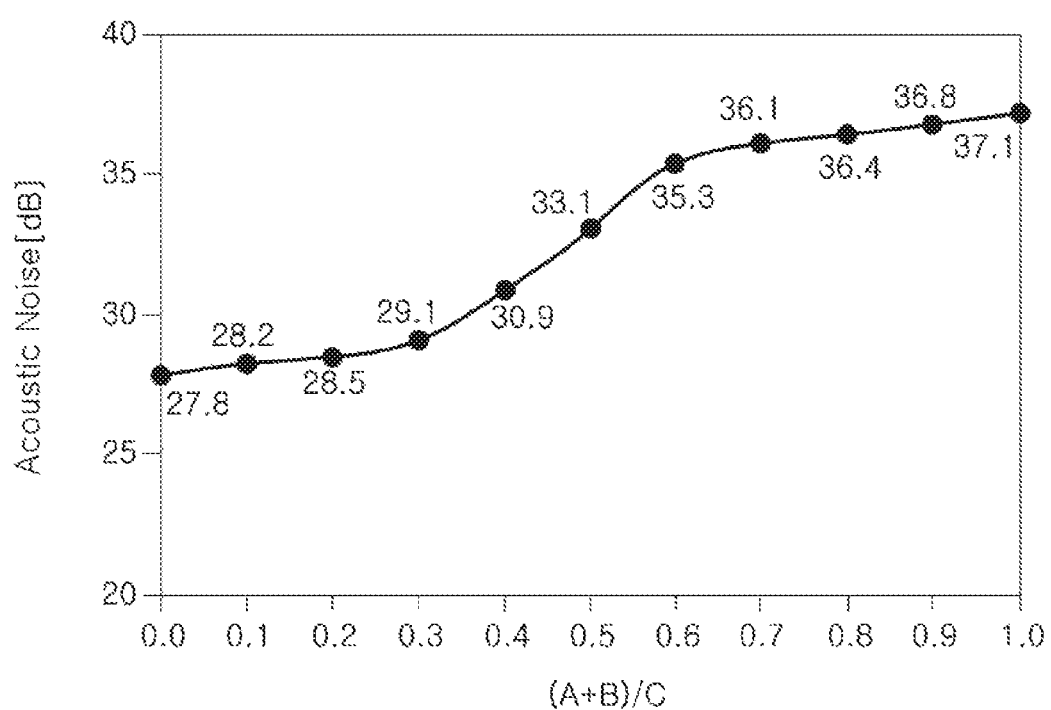
FIG. 6 is a graph illustrating changes of acoustic noise depending on an area of a cutting portion formed in a side connection portion.

FIG. 6 is a graph illustrating changes of acoustic noise depending on an area of a cutting portion formed in a side connection portion.

In the graph, "A" may be a thickness of a lower portion of a side connection portion, and "B" may be a thickness of an upper portion of the side connection portion, and "C" may be an overall thickness of an external terminal.

Referring to FIG. 6, when a ratio, (A+B)/C, between the overall thickness of the external terminal and an overall thickness of a portion other than an area from the side connection portion to a cutting portion exceeds 0.3, an increase in acoustic noise was high.

Accordingly, a threshold range of (A+B)/C in which acoustic noise is able to be reduced may be $0<(A+B)/C\leq0.3$.

Meanwhile, according to the exemplary embodiment, in an audible frequency of an electronic component, a frequency of 20 kHz or less, piezoelectric vibrations of the electronic component conveyed to a substrate may be prevented.

Thus, by reducing high frequency vibrations of an electronic component, it may be possible to prevent errors in sensors used in an IT industry/field caused by high frequency vibrations of the electronic component, a frequency of 20 kHz or higher, and prevent internal accumulation of fatigue caused by continuous vibration of a sensor.

According to the aforementioned exemplary embodiments, acoustic noise in an audible frequency region, a frequency of 20 kHz or less, and vibration in a high frequency, 20 kHz or higher, produced in an electronic component may be reduced.

While the exemplary embodiments have been shown and described above, it will be apparent to those skilled in the art that modifications and variations could be made without departing from the scope of the present invention as defined by the appended claims.

What is claimed is:

1. An electronic component, comprising:
a multilayer capacitor comprising a capacitor body, and an external electrode disposed on an end of the capacitor body; and
an interposer comprising an interposer body, and an external terminal disposed on an end of the interposer body,
wherein the external terminal includes a connection portion disposed on a first surface of the interposer body and electrically connected to the external electrode, a mounting portion disposed on a second surface of the interposer body opposing the first surface, and a side connection portion disposed on a first side surface of the interposer body to connect the connection portion and the mounting portion,
the side connection portion includes a cutting portion,
wherein the first and second surfaces oppose each other in a first direction,
wherein the interposer body includes second and third side surfaces opposing each other in a second direction perpendicular to the first direction,
wherein the side connection portion includes first and second portions opposing each other in the first direction,
wherein the first and second portions are disposed on at least one of the second or third side surface, and
wherein the cutting portion is arranged between the first and second portions in the first direction.

2. The electronic component of claim 1, wherein the cutting portion of the side connection portion is arranged in a central portion of the side connection portion in a thickness direction.

3. The electronic component of claim 1, wherein $0<(A+B)/C\leq0.3$, where A is a thickness of a lower portion of the side connection portion, B is a thickness of an upper portion of the side connection portion, and C is an overall thickness of the external terminal.

4. The electronic component of claim 1, further comprising:
a conductive adhesive layer disposed between the external electrode and the connection portion.

5. The electronic component of claim 1, wherein the interposer body includes alumina.

6. The electronic component of claim 1, wherein the capacitor body comprises first and second surfaces opposing each other, third and fourth surfaces connected to the first and second surfaces and opposing each other, and fifth and sixth surfaces connected to the first and second surfaces and the third and fourth surfaces and opposing each other, and comprising a plurality of dielectric layers, and a plurality of first and second internal electrodes alternately disposed with the dielectric layer interposed therebetween in a direction connecting the fifth and sixth surfaces, and one ends of the first and second internal electrodes are exposed through the third and fourth surfaces, respectively.

7. The electronic component of claim 6, wherein the external electrodes respectively comprise first and second head portions disposed on the third and fourth surfaces of the capacitor body, respectively, and electrically connected to the first and second internal electrodes, respectively, and first and second band portions extended from the first and second head portions to a portion of the first surface of the capacitor body, respectively.

8. The electronic component of claim 1, further comprising:
a plating layer disposed on a surface of the external electrode.

9. The electronic component of claim 8, wherein the plating layer includes a nickel (Ni) plated layer, and a tin (Sn) plated layer covering the nickel (Ni) plated layer.

10. The electronic component of claim 1, further comprising:
a plating layer disposed on a surface of the external terminal.

11. The electronic component of claim 10, wherein the plating layer includes a nickel (Ni) plated layer, and a tin (Sn) plated layer covering the nickel (Ni) plated layer.

12. The electronic component of claim 1, wherein the external electrode includes first and second external electrodes disposed on opposite end surfaces of the capacitor body, the external terminal includes first and second external terminals disposed on opposite ends of the interposer body, and the first and second external electrodes are electrically connected to the first and second external terminals, respectively.

13. The electronic component of claim 1, wherein the side connection portion is disposed on the first and second surfaces of the interposer body.

14. An electronic component, comprising:
a multilayer capacitor comprising a capacitor body, and an external electrode disposed on an end of the capacitor body; and
an interposer comprising an interposer body, and an external terminal disposed on an end of the interposer body,
wherein the external terminal includes a connection portion disposed on a first surface of the interposer body and electrically connected to the external electrode, a mounting portion disposed on a second surface of the interposer body opposing the first surface, and a side connection portion disposed on a side surface of the interposer body to connect the connection portion and the mounting portion,
wherein the side connection portion includes a cutting portion, and
wherein a thickness of the interposer body is greater at a central portion of the interposer body relative to an end of the interposer body, and the cutting portion of the side connection portion is disposed adjacent to a portion of the interposer body having a reduced thickness.

15. The electronic component of claim 14, wherein a step is disposed between the central portion of the interposer body and the portion of the interposer body having the reduced thickness.

16. An electronic component, comprising:
a multilayer capacitor comprising a capacitor body, and an external electrode disposed on an end of the capacitor body; and
an interposer comprising an interposer body, and an external terminal disposed on an end of the interposer body,
wherein the external terminal includes a connection portion disposed on a first surface of the interposer body and electrically connected to the external electrode, a mounting portion disposed on a second surface of the interposer body opposing the first surface, and a side connection portion disposed on, and completely covering, a side surface of the interposer body to connect the connection portion and the mounting portion, and
the side connection portion extends onto at least one other side surface of the interposer at which the side connection portion includes a cutting portion.

17. The electronic component of claim 1, wherein a thickness of the interposer body is greater at a central portion of the interposer body relative to an end of the interposer body, and the cutting portion of the side connection portion is disposed adjacent to a portion of the interposer body having a reduced thickness.

18. The electronic component of claim 17, wherein a step is disposed between the central portion of the interposer body and the portion of the interposer body having the reduced thickness.

19. The electronic component of claim 16, wherein a thickness of the interposer body is greater at a central portion of the interposer body relative to an end of the interposer body, and the cutting portion of the side connection portion is disposed adjacent to a portion of the interposer body having a reduced thickness.

20. The electronic component of claim 19, wherein a step is disposed between the central portion of the interposer body and the portion of the interposer body having the reduced thickness.

* * * * *